United States Patent [19]

Shafer

[11] Patent Number: 4,868,519
[45] Date of Patent: Sep. 19, 1989

[54] MICROPROCESSOR-CONTROLLED AMPLIFIER

[75] Inventor: James E. Shafer, Jackson, Miss.

[73] Assignee: DNIC Brokerage Company, Wilmette, Ill.

[21] Appl. No.: 266,093

[22] Filed: Nov. 2, 1988

[51] Int. Cl.$^4$ ............................................. H03G 3/30
[52] U.S. Cl. ................................... 330/284; 330/145
[58] Field of Search ................ 330/145, 284; 307/554, 307/568

[56] References Cited

U.S. PATENT DOCUMENTS

| | | | |
|---|---|---|---|
| 3,631,262 | 12/1971 | Jarrett | 330/284 X |
| 4,013,975 | 3/1977 | Kataoka et al. | 330/145 |
| 4,121,183 | 10/1978 | Murphy | 330/284 X |
| 4,468,631 | 8/1984 | Goldberg | 330/284 |
| 4,766,395 | 8/1988 | Dolby | 330/145 X |

FOREIGN PATENT DOCUMENTS

| | | | |
|---|---|---|---|
| 2403756 | 8/1975 | Fed. Rep. of Germany | 330/284 |
| 2650583 | 3/1978 | Fed. Rep. of Germany | 330/284 |
| 12413 | 1/1983 | Japan | 330/284 |
| 1417982 | 12/1975 | United Kingdom | 330/284 |

OTHER PUBLICATIONS

"FETs As Voltage-Controlled Resistors", Siliconox, pp. 7-75 to 7-83.
"A Linear Multiple Gain-Controlled Amplifier", by Jim Sherwin, Aug. 1975.

Primary Examiner—James B. Mullins
Attorney, Agent, or Firm—Milton S. Gerstein; Marvin Benn

[57] ABSTRACT

An amplifier circuit having an FET connected in series with a resistor coupled to a constant voltage source, coupled between a pair of amplifiers, such as audio amplifiers in a two-stage amplifying circuit. The FET specifically and directly determines the amount of gain of the two-stage amplifier, or the like. $R_{DS}$ of the FET is continually monitored by its connection to one input of an amplifier serving as a comparator, with the other input thereof serving as a reference voltage derived from a modulated signal emanating from a microprocessor. Each of the signals $V_{DS}$, and the reference from the microprocessor is filtered through a low pass filter to remove the audio, or other cyclical signals, and, in the latter case, in order to provide a substantially constant reference voltage to the input of the comparator. The output of the comparator is coupled to an RC circuit, the capacitor thereof being continually charged and discharged in response to the state of the output of the comparator. The output from the RC circuit is coupled to the FET to define the gate voltage of $V_{GS}$ thereof, which in turn determines the value of $R_{DS}$, to thereby continually alter $R_{DS}$, to thereby provide the gain so desired and specifically required in the amplifying circuitry. Such value is inherently defined by the modulated reference signal emanating from the microprocessor.

4 Claims, 1 Drawing Sheet

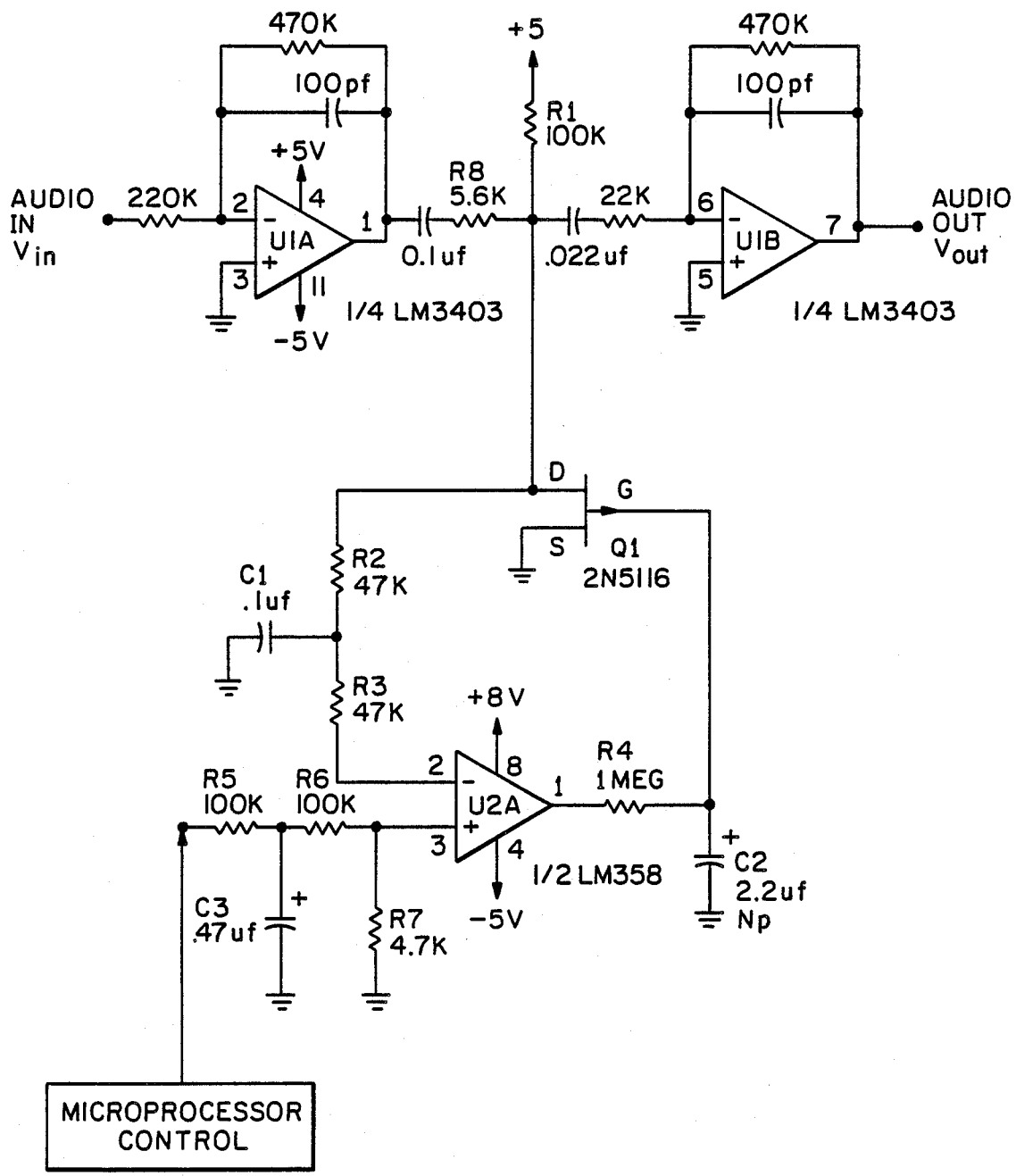

MICROPROCESSOR-CONTROLLED AMPLIFIER

BACKGROUND OF THE INVENTION

The present invention is directed to a circuit and method of controlling the gain of an audio amplifier via a microprocessor. It is known to use a p-channel or n-channel junction field effect transistor (FET) for controlling the gain of a circuit. Such prior art FET-controlled circuits depend on the particular parameters of the particular FET used, such as the pinch-off voltage, the minimum resistance of the FET, $R_{DS}$(on), and the like. Thus, the particular gain achieved in the circuit varies with the particular FET used, and varies from one type of FET to another.

It is the object of the present invention to provide a constant and predictable gain of an amplifying circuit that is independent of the particular FET used, and the parameters thereof. The present invention has special application to an audio-amplifying circuit, although other fields are also within the domain of the present invention.

SUMMARY OF THE INVENTION

It is, therefore, the primary objective of the present invention to provide a FET-controlled amplifying circuit that is independent of the field effect transistor used and the device parameters thereof, by which the gain of the amplifying circuit may be held constant, regardless of the type of FET used.

It is another objective of the present invention to provide such an FET-controlled amplifying circuit in which the FET-type device employed has its $R_{DS}$ monitored continually in order to determine the state thereof indicative of the desired gain of the amplifying circuit being controlled.

It is still another objective of the present invention to monitor such $R_{DS}$ in such a manner so as to control the desired value thereof, in order to achieve a specific and desired gain of the amplifying circuit. Such is accomplished via a microprocessor control, which provides a modulated reference signal upon which the gate voltage of the FET is continually adjusted to achieve the desired $R_{DS}$ for the desired and specific gain of the amplifier circuit.

Toward these and other ends, the circuit of the invention includes a JFET connected in series with a resistor coupled to a constant voltage source, coupled between a pair of amplifiers, such as audio amplifiers in a two-stage amplifying circuit. The FET specifically and directly determines the amount of gain of the two-stage amplifier, or the like, via $R_{DS}$. According to the invention, $R_{DS}$ is continually monitored by its connection to one input of an amplifier serving as a comparator, with the other input thereof serving as a reference voltage derived from a modulated signal emanating from a microprocessor. Each of the signals $V_{DS}$, and the reference from the microprocessor is filtered through a low pass filter to remove the audio, or other cyclical signals, and, in the latter case, in order to provide a substantially constant reference voltage to the input of the comparator. The output of the comparator is coupled to an RC circuit, the capacitor thereof being continually charged and discharged in response to the state of the output of the comparator. the output from the RC circuit is coupled to the FET to define the gate voltage of $V_{GS}$ thereof, which in turn determines the value of $R_{DS}$, to thereby continually alter $R_{DS}$, to thereby provide the gain so desired and specifically required in the amplifying circuitry. Such value is inherently defined by the modulated reference signal emanating from the microprocessor. Thus, each unique desired gain value of the amplifying circuit is uniquely determined by the signal emanating from the microprocessor, which in the preferred embodiment is achieved via the control of the duty cycle of the signal emanating from the microprocessor, which thereby uniquely determines the voltage achieved by the capacitor in the RC circuit coupled to, and determining, the $V_{GS}$ of the FET.

BRIEF DESCRIPTION OF THE DRAWINGS

The invention will be more readily understood with reference to the accompanying drawing, wherein:

The FIGURE is an electrical schematic incorporating the microprocessor-controlled FET-variable amplifying circuit of the present invention.

DETAILED DESCRIPTION OF THE INVENTION

Referring now to the figure, there is shown a two-stage audio amplifier, consisting of a first amplifier stage U1A, and a second amplifier stage U1B, in a conventional manner. The gain is defined by the ratio of audio output from the second stage amplifier U1B over the audio input $V_{in}$ of the first stage amplifier U1A. To achieve the desired gain, a JFET Q1 is employed, defining an operating resistance $R_{DS}$. Such resistance $R_{DS}$ is connected, according to the present invention, to a resistor R1, in the example shown of 100k, which, in turn, is connected to a +5 volt DC source, such series-connected FET and R1 being coupled between the two stages of the double stage amplifier, as shown in the figure.

In the conventional manner, variation of the resistance $R_{DS}$ will alter the gain, the FET Q1 thereby serving as a variable attenuator. The FET Q1 is continually monitored, such that the drain resistance $R_{DS}$ is continually changed in order to achieve a constant gain $V_{out}/V_{in}$, by directly acting upon the gate voltage $V_{GS}$. Specifically, there is provided a monitoring circuit incorporating a low-pass filter portion R2, R3, C1, which eliminates the audio or cyclical aspects of the signal, and provides only a DC signal emanating via the +5 voltage source connected to the resistance R1, which thus provides a segregated and unique indicator of the resistance $R_{DS}$ of the FET Q1. Thus-segregated DC source emanating from R3 is inputted into a first input of a comparator U2A, the output of which can take either one of two states thereof, either +8 volts or −5 volts, as shown. The value so taken by the comparator U2A is determined by the value of the other input thereof, which, as described above, emanates from a microprocessor. The other input, as just described, emanates from a microprocessor. The microprocessor providing a pulse-width modulated signal, at an amplitude of 5 volts peak-to-peak the duty cycle of which may vary anywhere from 0% to 100%. This signal from the microprocessor is filtered through a low-pass filter R5, R6, C3, R7, such that the input to the comparator is a substantially constant d.c. voltage. The duty cycle of the pulse-width modulated signal from the microprocessor is variable, thus allowing for a change of input to the comparator U2A, to a desired value thereof, which, in turn, will uniquely determine the value $R_{DS}$ via $V_{GS}$, as described below.

The pulse-width modulated signal from the microprocessor is well-known and conventional, it being understood that such a signal may be readily generated by conventional microprocessors. The comparator U2A compares the value indicative of $R_{DS}$ with the reference voltage generated by the microprocessor, and either takes the state of +8 or −5 volts. The output from the comparator U2A is coupled to RC circuit R4, C2, with capacitor C2 thereof charging and discharging depending upon the state of the comparator. The output from the capacitor C2 serves as the voltage which controls and determines the value of $V_{GS}$ of the FET Q1, to thereby continually change the value $R_{DS}$ to that reference value set by the signal emanating from the microprocessor, which is that value desired to be obtained in order to achieve the gain $V_{out}/V_{in}$ desired and required.

As previously mentioned, the duty cycle of the signal emanating from the microprocessor may be altered, in order to achieve a desired reference signal; the larger the percentage of the duty cycle, the high the reference voltage, and the longer the capacitor C2 will charge, thereby causing a $V_{GS}$, which, in turn, will cause a greater value of $R_{DS}$, to thereby increase the gain $V_{out}/V_{in}$. Upon reaching the desired value $R_{DS}$, the comparator U2A will have equal inputs thereof, the state thereof being switched to −5 volts, to thereby discharge the capacitor C2 with the cycle continuing.

In the circuit shown in the figure, the pulse-modulated signal from the microprocessor has a period of 277.78 microseconds, which, of course, may be changed. The low-pass filter consisting of R5, R6, R7 and C3, which develops a steady state DC voltage, will react much more quickly the shorter the period of the pulse-width modulated signal. The values of the circuit elements shown in the figure are shown by only by way of example, and, of course, may be altered and changed to suit desired results needed.

As with other circuits using FETs as gain control devices, it is important to keep the signal level applied to the drain of the FET low to avoid distortion. Using the values shown in the attached figure, an output signal level of at least 3 volts peak-to-peak can be achieved with no appreciable distortion.

One consideration in the choice of the FET is that a maximum of approximately +7 volts DC is available from pin 1 of comparator U2A as a voltage to be applied to the gate. Therefore, an FET with a high pinch-off voltage cannot be turned completely off. It is important to choose an FET with a low pinch-off voltage, such as the 2N 5116 with a pinch-off of 1–4 volts DC.

While a specific embodiment of the invention has been shown and described, it is to be understood that numerous changes and modifications may be made therein, without departing from the scope, spirit and intent of the invention as set forth in the appended claims. It is also to be understood that a MOSFET type device might be used instead of the JFET device described.

What I claim is:

1. An amplifier circuit comprising a pair of amplifiers connected in dual stage format, a field-effect transistor operatively coupled to an input of one amplifier of said pair for controlling the gain thereof;

means for monitoring the operating resistance of said field-effect transistor; and means responsive to said means for monitoring for adjusting the gate voltage of said field-effect transistor to thereby change said operating resistance of said field-effect transistor to achieve a desired and steady value thereof, whereby the gain of said at least one amplifier is held at a substantially constant value;

said means for monitoring comprising a first resistor connected in series with the drain of said field-effect transistor, said first resistor being coupled to a direct voltage source; said first resistor and said field-effect transistor being coupled between the output of a first one of said dual stage amplifier and an input of the second one of said dual stage amplifier; said means responsive to said means for monitoring comprising a comparator having a first input to which is coupled the drain of said field-effect transistor, said comparator having a second input to which is coupled a reference signal, said comparator having an output, said output of said comparator switching between two logic levels;

said means responsive to said means for monitoring further comprising an averaging circuit coupled between the output of said comparator and the gate of said field-effect transistor, said averaging circuit being continually charged and discharged in response to the state of said output of said comparator to continually increase or decrease the value of said gate voltage indicative of the value desired of operating resistive $R_{DS}$ of said field-effect transistor; and a microprocessor for generating said reference signal, said reference signal comprising a pulse-width modulated signal the duty cycle of which may be varied between 0% and 100%; said reference signal being adjustably alterable to a desired value by varying said duty cycle of said signal, whereby the operating resistance $R_{DS}$ field-effect transistor may achieve a desired value commensurate with the desired gain.

2. The amplifier circuit according to claim 1, wherein said averaging circuit comprises an RC circuit.

3. The amplifier circuit according to claim 1, wherein said means for monitoring further comprises a first low-pass filter operatively coupled between drain of said field-effect transistor and said first input of said comparator for eliminating non-DC values, and a second low-pass filter operatively coupled between said second input of said comparator and said microprocessor for providing a constant DC reference voltage to said second input of said comparator, whereby said DC reference signal to said second input of said comparator may be continually altered to a desired value via the alteration of the duty cycle of said modulated signal from said microprocessor.

4. The amplifier circuitry according to claim 3, wherein said first low-pass filter filters out audio signals.

* * * * *